Aug. 31, 1965 CHIH-TANG SAH 3,204,160
SURFACE-POTENTIAL CONTROLLED SEMICONDUCTOR DEVICE
Filed April 12, 1961 3 Sheets-Sheet 1
FIG-1
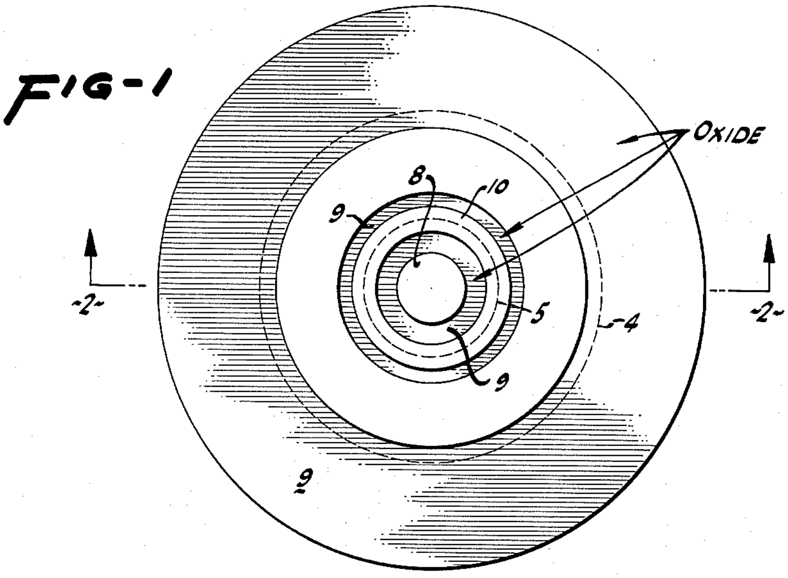
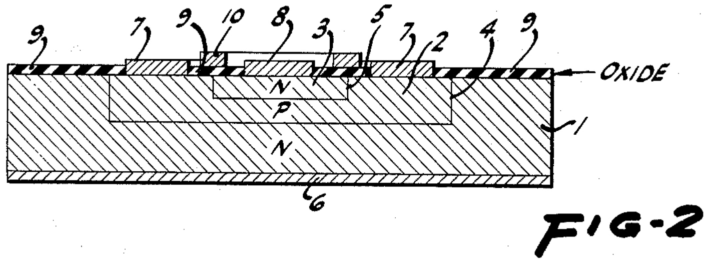
FIG-2
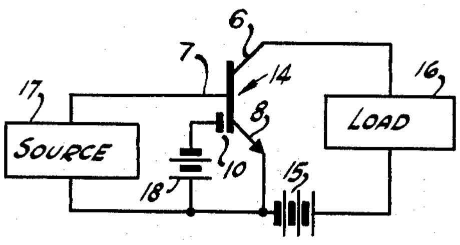
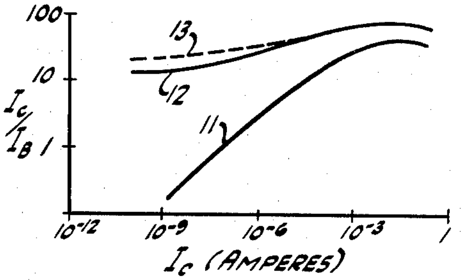
FIG-3
FIG-4
INVENTOR.
CHIH-TANG SAH
BY
Lippincott, Ralls & Hendricson
ATTORNEYS

SURFACE-POTENTIAL CONTROLLED SEMICONDUCTOR DEVICE

Filed April 12, 1961 3 Sheets-Sheet 2

INVENTOR.
CHIH-TANG SAH

BY

Lippincott, Ralls & Hendricson
ATTORNEYS

Aug. 31, 1965 CHIH-TANG SAH 3,204,160

SURFACE-POTENTIAL CONTROLLED SEMICONDUCTOR DEVICE

Filed April 12, 1961 3 Sheets-Sheet 3

INVENTOR.
CHIH-TANG SAH

BY

Lippincott, Ralls & Hendricson
ATTORNEYS

United States Patent Office 3,204,160
Patented Aug. 31, 1965

3,204,160
SURFACE-POTENTIAL CONTROLLED SEMICONDUCTOR DEVICE

Chih-Tang Sah, Mountain View, Calif., assignor, by mesne assignments, to Fairchild Camera and Instrument Corporation, Syosset, N.Y., a corporation of Delaware Filed Apr. 12, 1961, Ser. No. 102,515
3 Claims. (Cl. 317—235)

This invention relates to semiconductor devices, specifically, transistors, PNPN devices, and the like, useful as electronic switches, A.-C. and D.-C. amplifiers, oscillators, and mixers, and for other purposes. New devices are provided, having a high input impedance at a control or gate electrode, which makes these devices exceptionally suitable as solid-state replacements for vacuum tubes. In certain circuit configurations, devices herein described have voltage-current characteristics similar to those of a pentode vacuum tube.

In brief, the present invention concerns semiconductor devices that comprise a body of monocrystalline semiconductor containing adjacent regions of different conductivity types. A junction between two such regions, particularly an emitter-base junction, extends to the surface of the semiconductor and is bounded at said surface by an edge of the junction, which commonly extends around the perimeter of the emitter region. The usual electrodes are provided in contact with the semiconductor for providing electric current across the junction. In addition, an insulating film covers the edge of the junction, and a control or gate electrode, separated and insulated from the semiconductor by said film, is adjacent to the junction edge and is in capacitively coupled relation to the semiconductor in the immediate vicinity of said edge. Preferably, the insulating film is an oxidized layer on the surface of the semiconductor; particularly, when the semiconductor is silicon, the film preferably is a layer of silicon oxide.

Voltage applied to this control or gate electrode influences and controls the currents flowing between other electrodes of the device, in a manner herein explained. Because the gate electrode is insulated from the semiconductor body and is coupled thereto only by a small capacitance, the input impedance to the control or gate electrode is a high impedance, more nearly resembling the input impedance at the grid of a vacuum tube than that at any electrode of conventional semiconductor devices. However, the new devices are not limited to circuits in which a high input impedance is desired. Input signals may be supplied to the other, conventional electrodes of the transistor, e.g., emitter or base, while the newly added control or gate electrode is supplied with a bias voltage that improves the linearity of the transistor gain, a control voltage for varying the gain, e.g., a modulating voltage, or an AVC voltage, or other voltages for innumerable purposes.

The invention may be understood better from the following illustrative description and the accompanying drawings.

FIG. 1 of the drawings is a somewhat schematic, greatly enlarged, plan view of a transistor embodying the invention.

FIG. 2 is a somewhat schematic, transverse section taken along the line 2—2 of FIG. 1.

FIG. 3 is a graph showing the ratio of collector current to base current, plotted as a function of collector current, for different transistors.

FIG. 4 is a circuit diagram of one possible circuit using the transistor illustrated in FIGS. 1 and 2, the transistor itself being represented by a recommended symbol for this new device.

Figure 5:
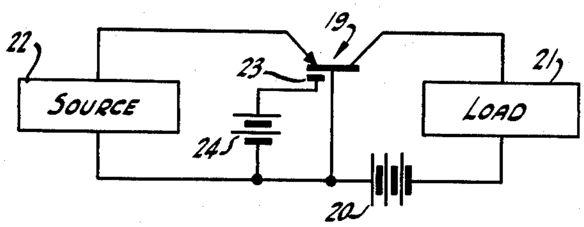
FIG. 5 is a circuit diagram of another possible circuit using a transistor embodying the invention.

FIGS. 1 and 2 illustrate an NPN transistor, having the customary emitter, base, and collector electrodes, and having an additional control or gate electrode which controls the surface potential at the edge of the emitter junction, in accordance with principles of the present invention. A PNP transistor would be the same, but with the conductivity type of each region reversed. As illustrated, a monocrystalline body of semiconductor, e.g., silicon or any other semiconductor useful in the fabrication of transistors, contains a collector region 1 of N conductivity type, a base region 2 of P conductivity type, and an emitter region 3 of N conductivity type. In the planar configuration illustrated, the base-collector junction between regions 1 and 2 extends to the top surface of the semiconductor and is bounded at this surface by a circular edge 4, which extends completely around the periphery of region 2. The emitter-base junction between regions 2 and 3 also extends to the top surface of the semiconductor and is bounded at this surface by a circular edge 5, which extends completely around the periphery of region 3. Electrodes 6, 7, and 8 are in ohmic contact with the collector, base, and emitter regions of the semiconductor, respectively. Conveniently, the electrode 6 may be a metal layer deposited on the back or under side of the semiconductor; electrode 7 may be an annular metal film deposited on the top surface of the semiconductor, over and in contact with the base region; and electrode 8 may be a metal-film disk, or dot, deposited on the top surface of the semiconductor, over and in contact with the emitter region, as shown.

Preferably, the whole top surface of the semiconductor, except the portions covered by contacts 7 and 8, is covered and protected by an insulating film 9; and preferably, the film 9 is an oxide of the semiconductor, formed by oxidizing the surface of the semiconductor at an early stage in fabricating the transistor, and firmly adherent to said surface. A reason for this is that the film 9 protects the junctions during and after manufacture, and results in a considerable improvement in transistor quality and reproducibility. The region 1 may have the conductivity of the original crystal from which the transistor is fabricated, and regions 2 and 3 may be formed by diffusing impurities through holes etched or engraved in the oxide layer 9, in accordance with processes already known to those skilled in the art.

However, insofar as the essential principles of the present invention are concerned, regions 1, 2, and 3 may be formed in any desired manner, and film 9 may be of any insulating material. Also, the essential requirement for film 9 is only that it cover the edge 5 of the emitter-base junction, to separate and insulate from the semiconductor body the control or gate electrode 10, described more fully in the next paragraph. Hence, the invention is not limited to transistors of the planar configuration illustrated, but may also be applied, for example, to mesa transistors.

In the embodiment illustrated, electrode 10 is an annular film of metal coated onto the insulating layer 9 immediately over edge 5 of the emitter-base junction, as shown, so that the electrode 10 is in capacitively coupled relation to the semiconductor in the immediate vicinity of edge 5 throughout the whole length of this edge. Thus, voltage applied to electrode 10 affects the surface potential at the junction edge 5, and has a significant effect upon currents flowing between other electrodes of the transistor, as herein explained. The metal film electrode adheres firmly to the insulating, oxide layer, and forms a durable structure.

Before proceeding with a description of operating principles of the transistor illustrated in FIGS. 1 and 2, it will be helpful to consider the relations illustrated graphically in FIG. 3. It is well known that an important index of transistor performance is the ratio of collector current $I_C$ to base current $I_B$. Because this ratio, sometimes identified by the symbol $h_{FE}$, represents the useful current gain of the transistor, generally it should be reasonably large, e.g., ten or more.

In FIG. 3, curve 11 illustrates a typical variation in the current gain as a function of collector current, in a diffused-junction silicon transistor wherein the edge of the emitter-base junction is unprotected, i.e., there is no oxide film 9 covering the edge of the emitter-base junction at the surface of the body of semiconductor. It will be noted that the ratio $I_C/I_B$ drops sharply as the collector current $I_C$ is decreased to small values—at low current values, the ratio is approximately equal to the square root of the collector current. This drop-off in the current gain of the transistor at low current values can be explained as a loss mechanism which occurs at the surface in the transition region of the emitter-base junction. Although the junction is narrow, it embraces a transition region of finite width containing, particularly at the surface where the crystal structure is unsymmetrical, recombination centers at which charge carriers are trapped and combine with carriers of opposite polarity. Thus, according to present theory, positive and negative carriers recombine at the surface edge of the emitter-base junction, at rates expressed by the recombination velocities $S_{po}$ and $S_{no}$, which are similar to the quantities $\tau_{po}$ and $\tau_{no}$ in the Shockley-Read-Hall theory of electron-hole recombination via deep impurity levels. The so-recombining carriers constitute a current, across the emitter-base junction, that makes no effective contribution to the collector current, and which, therefore, decreases the current gain of the transistor. The theoretical variation of this loss, as a function of emitter-base voltage and temperature, is of exactly the form needed to explain the observed low-current fall-off in $h_{FE}$.

Two things can be done to reduce the surface recombination losses described above: (1) the magnitude of the surface recombination velocities $S_{po}$ and $S_{no}$ can be reduced by reducing the surface-state densities, to which they are proportional, and (2) the electric potential at the surface of the crystal can be controlled to shift the energy levels of the recombination centers from favorable to unfavorable positions relative to the Fermi level near the surface of the crystals, and thus to make the surface recombination centers relatively ineffective to recombine the carriers. In transistors of the planar configuration having junctions completely protected by an oxide film, the oxide reduces the recombination velocities largely by means (1) and, perhaps to a considerable extent, by means (2), above. Hence, in such an oxide-protected transistor, it may be expected that the drop-off in current gain at low current values will be smaller than it is in transistors having unprotected junctions. This is found to be the case: curve 12 of FIG. 3 represents the current gain, as a function of collector current, for a high-quality planar transistor wherein the edges of the junctions are fully protected by an oxide film during and after manufacture. In other words, curve 12 applies to a planar transistor as illustrated in FIGS. 1 and 2, but without the newly-added control or gate electrode 10; whereas curve 11 applies to a similar transistor with the oxide film 9 removed.

According to the present invention, the surface recombination velocities $S_{po}$ and $S_{no}$ are controlled and made variable by means of voltage applied to the newly-added control or gate electrode 10, which is capacitively coupled to the semiconductor in the immediate vicinity of edge 5 of the emitter-base junction. From one viewpoint, voltage applied to electrode 10 varies the electric surface potential in the vicinity of edge 5 and thus shifts the Fermi level near the surface of the crystal, in relation to the surface recombination centers, in such a way that the recombination centers are moved to more or less favorable positions, selectively, depending upon the magnitude and polarity of the applied voltage. From another viewpoint, the voltage applied to electrode 10 influences the paths of current flow across the junction by inducing a surface channel in the base region near the junction, to provide greater or less opportunity for the recombination of charges at the surface, by altering the distribution of electric charges within the semiconductor, particularly within the emitter-base junction region. For example, assuming an N-type emitter region 3, which is more heavily doped than the P-type base region 2, the largest portion of the current across the emitter-base junction will consist of electrons passing from the emitter region to the base region. Those passing across the junction edge close to the semiconductor surface in the channel are most likely to recombine with holes, and thus to decrease the ratio of collector current to base current. A negative voltage applied to electrode 10 will charge the capacitance between this electrode and the semiconductor by pushing electrons away from the semiconductor surface, and thus will decrease the population of electrons within the emitter region and the size of the surface channel in the base region in the immediate vicinity of the junction edge, which in turn will decrease the opportunities for surface recombination, whereas a positive voltage applied to electrode 10 will have the opposite effect. These two viewpoints are more or less equivalent and complementary, and lead to a nearly correct explanation of the observed phenomena, but the second may be easier to visualize in certain instances.

In any event, whatever the completely accurate explanation, it has been demonstrated that relatively small voltages (as small as one or two volts) applied to the newly-added control or gate electrode 10 have a significant effect upon the observed fall-off in the ratio of collector current to base current at low current values. Specifically, with different bias voltages applied to electrode 10, the $h_{FE}$ characteristic of the transistor illustrated in FIGS. 1 and 2 can be made to approach that of curve 11, FIG. 3, or that of curve 12, FIG. 3, selectively, and at an optimum value of the bias voltage, which can best be determined by trial and error, may result in a characteristic curve more linear than curve 12, e.g., the broken-line curve 13 of FIG. 3.

One useful application of the present invention is to achieve a superlinear transistor—one that can be operated over an exceptionally wide range of current values with a useful current gain, and with a current gain that is more nearly constant than has heretofore been possible over a comparably wide range of current values. This is achieved by applying to the control or gate electrode 10 a bias voltage of optimum value (which can best be ascertained by experiment) to obtain the more nearly flat curve 13. A typical circuit for utilizing the new transistor in this manner is illustrated in FIG. 4.

Referring to FIG. 4, the transistor illustrated in FIGS. 1 and 2, and hereinbefore described, is represented by a recommended symbol for this new type of transistor, indicated generally by the reference number 14. The base electrode 7, collector electrode 6, and emitter electrode 8 are conventionally represented as in the standard transistor symbol. The arrowhead pointing away from the base on the emitter electrode signifies that the transistor is of the NPN type. The newly-added control or gate electrode 10 is shown in a manner suggestive of its capacitively coupled relation to the edge of the emitter-base junction.

In the particular circuit illustrated in FIG. 4, the transistor 14 is connected in a generally conventional, grounded-emitter circuit configuration. The emitter-collector operating voltage is provided by a battery or other voltage supply 15 connected in series with load 16, which receives the amplified output signal from the collector 6. The input signal (current) source 17 is connected between the base 7 and the emitter 8. The control or gate electrode 10 is connected to a bias voltage supply 18, e.g., a battery, connected between the gate electrode and emitter electrode 8 in the example illustrated. The magnitude and polarity of the bias voltage provided by supply 18 may be selected to give the least variation in the ratio of collector current to base current over a large range of collector-current values.

The functions and operation of transistor 14 in the circuit of FIG. 4 are substantially identical to those of a conventional transistor connected as a grounded-emitter amplifier, or the like, except for the increased linearity obtained by application of the optimum bias voltage to the newly-added control or gate electrode 10. This increased linearity makes the transistor useful over a wider range of current values than heretofore.

FIG. 5 shows a circuit that is generally similar in configuration and purposes to the circuit of FIG. 4, except that in FIG. 5 the transistor, indicated generally at 19, is of the PNP type and is connected in a grounded-base circuit configuration. The base-collector voltage is provided by voltage supply 20, connected in series with load 21, and the input signal (current) source 22 is connected between the base and emitter electrodes of the transistor. The arrowhead pointing toward the base on the emitter lead indicates, in the customary manner, that the transistor is of the PNP type. The newly-added control or gate electrode 23, which is in capacitively coupled relation to the edge of the emitter-base junction, is provided with optimum bias voltage, for greatest linearity of the transistor characteristic $h_{FE}$, by means of a bias voltage supply 24 connected, in this instance, between the gate electrode 23 and the base electrode of the transistor.

Another useful application of the present invention is to provide a transistor with a high input impedance resembling the input impedance at the grid of a vacuum tube. This is achieved by connecting the newly-added control or gate electrode to the input signal source. Because the gate electrode is completely separated and insulated from the semiconductor by the insulator covering the edge of the emitter-base junction, the input conductance at the gate electrode is negligible, and the input impedance consists essentially of the reactance of the small capacitance—five micromicrofarads in a typical design—between the gate electrode and the semiconductor. A typical circuit for utilizing the new transistor in this manner is illustrated in FIG. 6.

Figure 6:
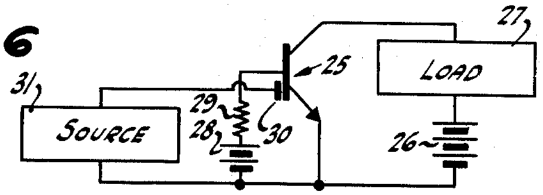
FIG. 6 is a circuit diagram of still another possible circuit.

Referring to FIG. 6, the transistor shown symbolically at 25 may be similar to the transistor illustrated in more detail in FIGS. 1 and 2. As illustrated, transistor 25 is an NPN transistor connected in a grounded-emitter circuit. The emitter-collector operating voltage is provided by a battery or other voltage supply 26 connected in series with the load 27 between the emitter and collector electrodes. A constant bias current is supplied to the base, e.g., by means of the battery 28 and resistor 29 connected in series between the emitter and base electrodes, as shown. The newly-added control or gate electrode, in capacitively coupled relation to the emitter-base junction of the transistor, is symbolically shown at 30. The input signal (voltage) source 31 is connected between the gate electrode 30 and one of the other electrodes of the transistor—in this instance, the emitter electrode.

Figure 7:
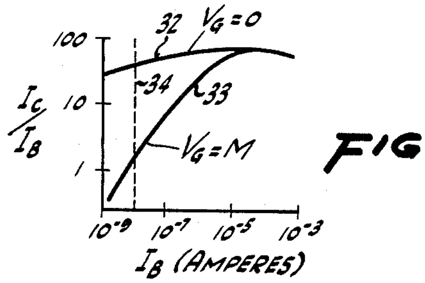
FIG. 7 is a graph showing the ratio of collector current to base current, plotted as a function of base current, at two different gate electrode voltages, for the transistor in the circuit illustrated in FIG. 6.

Operation of the circuit shown in FIG. 6 can best be understood by referring to FIG. 7, which is a graph depicting the ratio of collector current $I_C$ to base current $I_B$, plotted as a function of base current for different values of voltage $V_G$ applied to the gate electrode 30. Curve 32 represents the current gain of the transistor with zero voltage applied to the gate electrode—the surface recombination velocities are small and the ratio of collector current to base current is high over a wide range of current values, because of the favorable effects of the oxide insulating layer which protects the junction edges of the transistor. Curve 33 represents the current gain of the transistor when the voltage $V_G$ applied to gate electrode 30 has a maximum value M of such polarity (positive in the case of an NPN transistor) that the current gain of the transistor is greatly reduced at low current values. The vertical broken line 34 represents a selected value of the constant bias current supplied to the base of transistor 25 by battery 28 and resistor 29.

It is evident that the collector current $I_C$ may be changed by as much as fifty to one by changing the gate voltage $V_G$ from zero to M, usually several volts. As has been noted, the input impedance at gate electrode 30 is very high, essentially the reactance of a capacitance of about five micromicrofarads. With a high-impedance load, this amplifier may give a good voltage gain. Those skilled in the art will understand that an appropriate bias voltage may be connected in series with source 31 if the input signals from the source are of alternating polarity, or if such bias is otherwise necessary in order to keep the input signal variations between the gate electrode 20 and the emitter electrode within the range $V_G=0$ to $V_G=M$.

The useful frequency range of the circuit shown in FIG. 6 appears to be limited primarily by the surface relaxation process, and may be increased by increasing the surface recombination velocities at the emitter-base junction of the transistor to speed up the response. In many applications, e.g., as a low-level, differential, chopper-amplifier, or a D.-C. electrometer, speed of response is no problem.

Figure 8:
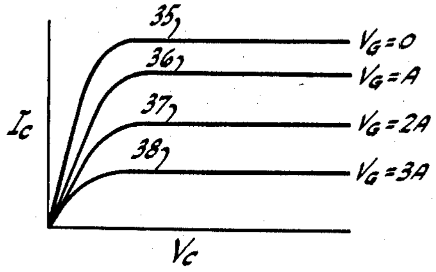
FIG. 8 is a graph showing the collector current, plotted as a function of the collector voltage, at four different gate electrode voltages, for the transistor in the circuit illustrated in FIG. 6.

FIG. 8 is a graph showing collector current $I_C$ plotted as a function of collector voltage $V_C$ for one of the new transistors, connected in a grounded-emitter circuit similar to that shown in FIG. 6, at a constant base current of one milliampere, and at several different values of voltage $V_G$ applied between the gate and emitter electrodes of the transistor. Curve 35 represents the characteristic obtained at a gate voltage $V_G=0$; curve 36 represents the characteristic obtained at a gate voltage $V_G=A$, typically about ten volts; curve 37 represents the characteristic obtained at $V_G=2A$; and curve 38 represents the characteristic obtained at $V_G=3A$.

It will be noted that the curves shown in FIG. 8 resemble the plate-current-versus-plate-voltage characteristic curves of a pentode vacuum tube operated at different grid voltages. Hence, the new transistor is highly suitable as a replacement for pentode vacuum tubes in numerous circuits wherein such vacuum tubes have been used in the past, with minimum modification of the circuit. Such a replacement achieves the well-known advantages of solid-state circuit elements over vacuum tubes; longer life, greater reliability, saving in space and weight; and elimination of filament supplies.

It is interesting that the gate electrode voltage which reduces the ratio of collector current to base current may be of the same polarity as the emitter-collector supply voltage. Thus, if the gate electrode is coupled to the collector, there is positive feedback which makes possible an exceptionally high (with appropriate adjustment, essentially infinite) collector impedance, even at high current and voltage values at which the Early effect (i.e., space charge widening) becomes important. Further increase of the bias voltage between the gate and collector electrodes results in a negative resistance characteristic between the collector and emitter electrodes of the transistor. These effects are illustrated in FIGS. 9 and 10.

Figure 9:
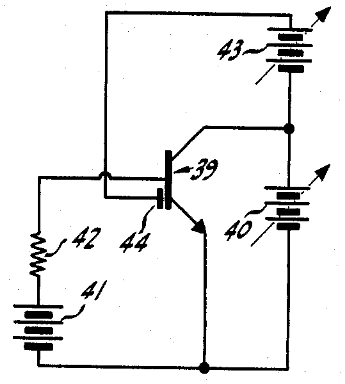
FIG. 9 is still another circuit diagram of a possible circuit using a transistor embodying the invention.

Referring to FIG. 9, the NPN transistor represented symbolically at 39 is supplied with an adjustable emitter-collector voltage $V_C$ by the adjustable voltage supply 40. A constant current is supplied to the base of the transistor by means of voltage supply 41 and resistor 42 connected in series between the emitter and base electrodes. Adjustable voltage supply 43 provides an adjustable bias voltage $V_G$ between the collector electrode and the newly-added control or gate electrode 44 of the transistor.

Figure 10:
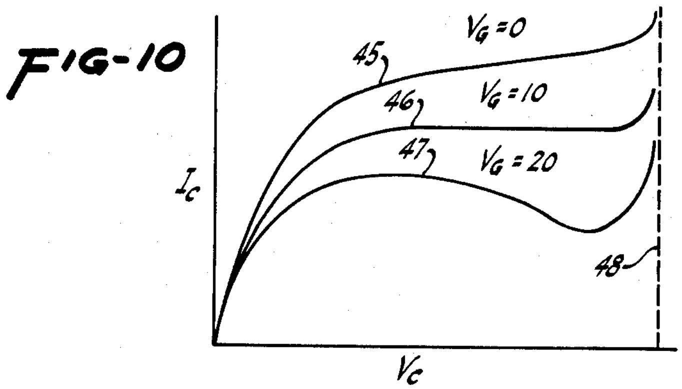
FIG. 10 is a graph of collector current, plotted as a function of collector voltage, at three different gate electrode voltages, for the transistor in the circuit illustrated in FIG. 9.

FIG. 10 illustrates the relation of collector current $I_C$ to collector voltage $V_C$ for the circuit shown in FIG. 9, plotted at several different values of the gate electrode voltage $V_G$ relative to collector voltage. Curve 45 represents the collector voltage-current characteristic at $V_G=0$. It will be noted that all portions of curve 45 slope upward toward the right, showing that the emitter-collector resistance is positive. Curve 46 shows the characteristic at $V_G=10$ volts. It will be noted that a considerable portion of curve 46 is essentially horizontal—within this region, the emitter-collector resistance is essentially infinite. Curve 47 represents the characteristic at a larger bias voltage, i.e., $V_G=20$ volts. A portion of curve 47 slopes downward toward the right, and within this region the emitter-collector resistance is negative. The vertical broken line 48 represents the value of collector voltage $V_C$ at which breakdown occurs, and the collector current $I_C$ rises uncontrollably.

Many useful applications of the characteristics illustrated in FIGS. 9 and 10 will occur to those skilled in the art. Operation in the region of high collector impedance is particularly advantageous for coupling to high-impedance loads, for well-known reasons. In the negative resistance region, the device may be used for amplification, the generation of oscillations, etc., in a manner analogous to the use of other negative resistance devices heretofore known.

Figure 11:
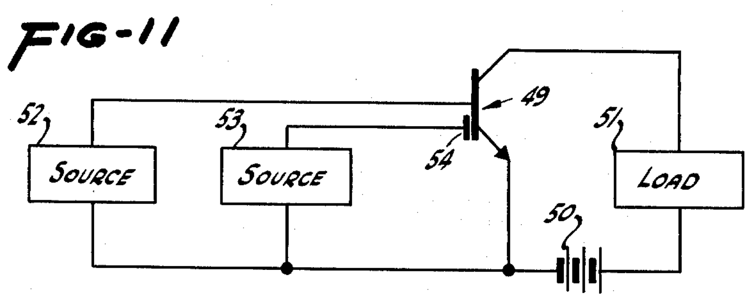
FIG. 11 is a circuit diagram of still another circuit using a transistor embodying the invention.

As has already been expalined, variations in the voltage applied to the newly-added control or gate electrode serve to vary and control the current gain between other electrodes of the transistor. Thus, the new transistor can be used, in a manner analogous to use of multigrid vacuum tubes, to form variable-gain amplifiers, mixers, and the like. FIG. 11 is one example of such use.

Referring to FIG. 11, the transistor shown symbolically at 49 is of the NPN type, and is connected in the grounded-emitter circuit configuration. The voltage supply 50 is conventionally connected in series with the load 51 between the emitter and collector electrodes of the transistor. A first input signal (current) source 52 is conventionally connected between the emitter and base electrodes of the transistor 49. A second input signal (voltage) source 53 is connected between the emitter electrode and the newly-added control or gate electrode 54.

So long as the voltage at gate electrode 54 remains constant, transistor 49 merely amplifies the signal supplied by source 52 to the base electrode of the transistor, and transmits the amplified signal to load 51. However, as has been explained, the current gain of the transistor depends upon the voltage applied to gate electrode 54, and thus, the amplitude of the signal transmitted to load 51 varies responsive to variations in the voltage applied to gate electrode 54.

From the foregoing, it will be evident that a number of useful effects can be achieved by the use of various sources 53 to cause voltage variations of a desired type at the gate electrode. For example, if source 53 is simply a manually variable D.-C. voltage source, then it provides means for manually adjusting the gain of the amplifier. If source 53 is a conventional AVC (automatic volume control) voltage source—e.g., a detector associated with the load 51, with appropriate filter circuits—then the amplifier gain will be automatically adjusted to maintain an essentially constant signal level at the output, in the same manner as in well-known vacuum tube AVC circuits. On the other hand, if singal source 53 is a source of alternating voltage, e.g., an oscillator, then the signal supplied by source 52 will be amplitude-modulated by, or heterodyned with, the signal supplied by source 53. Thus, the circuit shown in FIG. 7 may be used as a modulator or mixer.

The invention is not limited to NPN and PNP tranistors—it is also applicable to other semiconductor devices containing regions of different conductivity types with junctions therebetween. For example, it is applicable to PNPN devices, used for electronic switching and the like.

Figure 12:
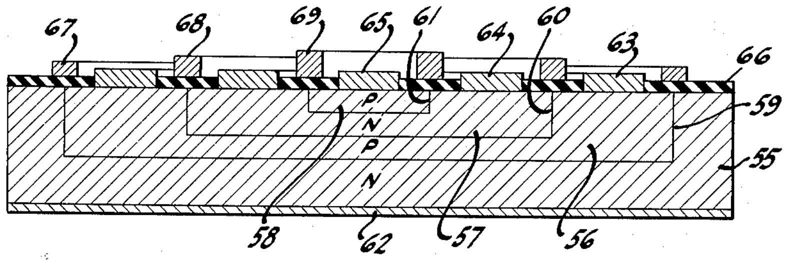
FIG. 12 is a somewhat schematic, greatly enlarged, transverse section of a PNPN device embodying the invention.

Referring to FIG. 12, a PNPN device, illustrated, comprises a region of N conductivity type 55, a region of P conductivity type 56, a second region of N conductivity type 57, and a second region of P conductivity type 58, with junctions therebetween having circular edges, 59, 60, and 61, that extend to the top surface of the monocrystalline body of semiconductor, e.g., silicon. Electrode 62 on the bottom surface of the semiconductor is in ohmic contact with region 55, and one or more electrodes 63, 64, and 65 on the top surface of the semiconductor are in ohmic contact with respective ones of the regions 56, 57, and 58. All of the top surface of the semiconductor, except that occupied by the electrodes, is preferably covered by an insulating layer 66 which covers the junction edges 59, 60, and 61. Preferably, the layer 66 is an oxidized layer of the semiconductor, e.g., silicon oxide, formed on the top surface of the semiconductor during manufacture of the device.

One or more control or gate electrodes, 67, 68, and 69, are provided on top of the insulating layer 66, adjacent to respective ones of the junction edges 59, 60, and 61, in capacitively coupled relation to the semiconductor in the immediate vicinity of the junction edges, in accordance with the inventive principles hereinbefore explained. Thus, the device illustrated may have as many as seven electrodes, four of which make ohmic contact with the four regions of alternate conductivity types, and three of which are in capacitively coupled relation to the three junction edges. For some applications all of these electrodes are not needed, and may be omitted—the device may have as few as three electrodes, two in ohmic contact with different regions of the semiconductor, and one in capacitively coupled relation to one of the junction edges.

A common use for PNPN devices is as an electronic switch, which may present either a high resistance (conduct little current at relatively high voltage) between electrodes 62 and 65, or may present a low resistance (conduct a relatively large current at low voltage) between electrodes 62 and 65. Both of the two end (top and bottom) regions 55 and 58 may act as emitter regions, while the two intermediate regions 56 and 57 act as base regions. Thus, the top and bottom junctions may both be emitter-base junctions, and the middle junction may sometimes act somewhat like a collector junction. In the high resistance state, the middle junction has a large reverse voltage across it. In the low resistance state, all three junctions commonly become forward-biased.

The PNPN device can be switched to either the high-resistance or the low-resistance state, selectively, by switching signals supplied to one or more switching electrodes 63 and 64, as is well known to those skilled in the art, as well as by signals applied to the principal electrodes 62 and 65. However, all of these prior-art switching devices require relatively high-current switching signals, because of the low input impedances present at the previously known electrodes that are in ohmic contact with the semiconductor.

The provision of one or more of the newly-added control or gate electrodes 67, 68, and 69, in capacitively coupled relation to the semiconductor in the immediate vicinity of a junction edge in accordance with the principles herein disclosed, provides a switching terminal having a high input impedance. In other words, voltages applied to the newly-added electrodes 67, 68, and 69, particularly 67 and 69, vary the surface recombination losses of the device and are thus effective to switch the device from one conductivity state to the other. Because these newly-added electrodes are insulated from the semiconductor body and are coupled thereto only through a small capacitance, the newly-provided switching terminals have high-impedance inputs, and the device may be switched from one state to the other by small-current switching signals. This has the advantage of making possible, in many instances, a considerable and important reduction in the size, cost, and power requirements of the switching circuits.

It will be appreciated that the specified embodiments illustrated and described are but a few examples of the large number of variations possible within the scope of the inventive principles herein disclosed.

What is claimed is:

1. A PNPN device comprising a monocrystalline body of semiconductor containing four successive layers, one inset into the next, of P and N conductivity types alternately, with three PN diffused junctions therebetween, two electrodes in ohmic contact with the uppermost and the lowermost of said layers, respectively, for passing current across said junctions, the uppermost of said junctions having an edge at a surface of said body, the lowermost of said junctions having an edge at a surface of said body, an insulating layer of an oxide of silicon covering at least one of said edges, and a control electrode, separated and insulated from said body by said insulating layer having a fixed dielectric constant, adjacent to said one edge and in capacitively coupled relation to the semiconductor in the immediate vicinity of said one edge.

2. A PNPN device as in claim 1, comprising another control electrode adjacent to the other of said edges and in capacitively coupled relation to the semiconductor in the immediate vicinity of said other edge.

3. A silicon semiconductor device comprising a body of semiconductor having a collector region of one conductivity type, a diffused base region of opposite conductivity type disposed within said collector region and extending inwardly from a surface of said collector region, a diffused emitter region of the same conductivity as said collector region disposed within said base region and extending inwardly from said surface, an emitter-base junction between said emitter region and said base region having an edge extending to said surface, a base-collector junction between said base region and said collector region extending to said surface, an integral silicon oxide insulating layer over said edge of said emitter-base junction on said surface, a control electrode on said insulating layer in capacitively coupled relation to said edge of said emitter-base junction, and electrode means for making electrical contact to said emitter, base and collector regions, the emitter and base contacts being attached to areas of the emitter and base regions at said surface.

References Cited by the Examiner

UNITED STATES PATENTS

| | | | |
|---|---|---|---|
| 2,791,760 | 5/57 | Ross | 340—173 |
| 2,791,761 | 5/57 | Morton | 340—173 |
| 2,816,850 | 12/57 | Haring | 148—1.5 |
| 3,056,888 | 10/62 | Atalla | 307—88.5 |
| 3,060,372 | 10/62 | Dacey | 307—88.5 |
| 3,064,167 | 11/62 | Hoerni | 317—234 |
| 3,090,873 | 5/63 | Mackintosh | 307—88.5 |
| 3,097,308 | 7/63 | Wallmark | 307—88.5 |
| 3,102,230 | 8/63 | Kahng | 317—235 |

DAVID J. GALVIN, *Primary Examiner.*

HERMAN KARL SAALBACH, JOHN W. HUCKERT, ARTHUR GAUSS, *Examiners.*